(12) United States Patent
Chen et al.

(10) Patent No.: US 8,907,441 B2
(45) Date of Patent: Dec. 9, 2014

(54) METHODS FOR DOUBLE-PATTERNING-COMPLIANT STANDARD CELL DESIGN

(75) Inventors: Huang-Yu Chen, Zhudong Township (TW); Yuan-Te Hou, Hsin-Chu (TW); Fung Song Lee, Banciao (TW); Wen-Ju Yang, Hsin-Chu (TW); Gwan Sin Chang, Hsin-Chu (TW); Yi-Kan Cheng, Taipei (TW); Li-Chun Tien, Tainan (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 535 days.

(21) Appl. No.: 12/702,885

(22) Filed: Feb. 9, 2010

(65) Prior Publication Data

US 2011/0193234 A1 Aug. 11, 2011

(51) Int. Cl.
- *H01L 21/70* (2006.01)
- *H01L 27/02* (2006.01)
- *H01L 23/528* (2006.01)
- *H01L 27/118* (2006.01)

(52) U.S. Cl.
CPC ..... *H01L 27/0207* (2013.01); *H01L 2924/0002* (2013.01); *H01L 23/5286* (2013.01); *H01L 27/11807* (2013.01)
USPC .......................................... 257/499; 257/506

(58) Field of Classification Search
USPC .................................................. 257/499, 506
See application file for complete search history.

(56) References Cited

U.S. PATENT DOCUMENTS

| | | | |
|---|---|---|---|
| 2009/0187871 A1* | 7/2009 | Cork ............................... | 716/11 |
| 2010/0155783 A1* | 6/2010 | Law et al. ..................... | 257/206 |
| 2011/0103125 A1* | 5/2011 | Tomishima .................... | 365/72 |
| 2011/0156755 A1* | 6/2011 | Veendrick et al. ............ | 326/103 |

OTHER PUBLICATIONS

Hsu, C-H., et al., "Simultaneous Layout Migration and Decomposition for Double Patterning Technology," IEEE/ACM International Conference on Computer-Aided Design Digest of Technical Papers, 2009, pp. 595-600.
Kahng, A., et al., "Layout Decomposition for Double Patterning Lithography," IEEE, 2008, pp. 465-472.

* cited by examiner

*Primary Examiner* — Jae Lee
(74) *Attorney, Agent, or Firm* — Slater & Matsil, L.L.P.

(57) ABSTRACT

A semiconductor chip includes a row of cells, with each of the cells including a VDD line and a VSS line. All VDD lines of the cells are connected as a single VDD line, and all VSS lines of the cells are connected as a single VSS line. No double-patterning full trace having an even number of G0 paths exists in the row of cells, or no double-patterning full trace having an odd number of G0 paths exists in the row of cells.

20 Claims, 8 Drawing Sheets

METHODS FOR DOUBLE-PATTERNING-COMPLIANT STANDARD CELL DESIGN

TECHNICAL FIELD

This disclosure relates generally to integrated circuit design and more particularly to using double-patterning technology to form integrated circuits.

BACKGROUND

Double-patterning is a technology developed for lithography to enhance the feature density. Typically, for forming features of integrated circuits on wafers, lithography technology is used, which involves applying a photo resist, and defining patterns on the photo resist. The patterns in the patterned photo resist are first defined in a lithography mask and are implemented either by the transparent portions or by the opaque portions in the lithography mask. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double-patterning technology is introduced. The closely located features are separated into two masks of a same double-patterning mask set, with both masks used to expose the same photo resist. In each of the masks, the distances between features are increased over the distances between features in the otherwise single mask, and hence the optical proximity effect is reduced, or substantially eliminated.

Figure 1:
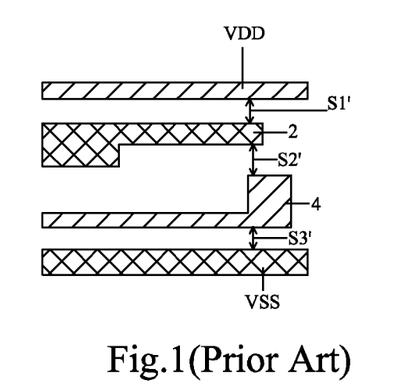
FIGS. 1 and 2 illustrate a conventional double-patterning cell design, wherein two cells have native conflicts when abutted.
Figure 2:
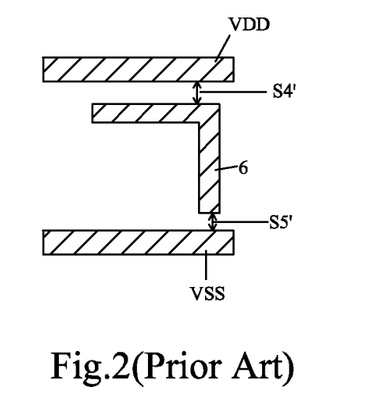

However, double-patterning technology cannot solve native conflict problems occurring when two cells are abutted. For example, referring to FIG. 1, a first cell includes features VDD, VSS, 2, and 4 that are closely located with distances S1', S2', and S3' being smaller than the lithography limit. Therefore, the double-patterning technology may be used to increase the distances between features VDD, VSS, 2, and 4. Referring to FIG. 2, a second cell includes features VDD, VSS, and 6 that are closely located with both distances S4' and S5' being smaller than the lithography limit. Therefore, the double-patterning technology may also be used. However, if the first cell and the second cell are to be abutted, a problem arises. In the first cell, features VDD and 4 have to be in a same mask, and features VSS and 2 have to be in a same mask different from the mask of features VDD and 4. In the second cell, VDD and VSS have to be in a same mask that is different from the mask of feature 6. Accordingly, the first cell and the second cell have a conflicting requirement regarding whether features VDD and VSS should be in a same mask or different masks.

SUMMARY

In accordance with one aspect of the embodiment, a semiconductor chip includes a row of cells, with each of the cells including a VDD line and a VSS line. All VDD lines of the cells are connected as a single VDD line, and all VSS lines of the cells are connected as a single VSS line. No double-patterning full trace having an even number of G0 paths exists in the row of cells, or no double-patterning full trace having an odd number of G0 paths exists in the row of cells.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel double-patterning design method is provided. The variations of the embodiment are discussed. Throughout the various views and illustrative embodiments, like reference numbers are used to designate like elements. Further, the features discussed hereinafter may be in a same lithography mask, or may be separated into two lithography masks of a same double-patterning mask set.

In a cell library, there is a plurality of pre-designed standard cells. At the time an integrated circuit is laid out, the standard cells in the cell library are copied to the desirable locations (known as "placement") of a chip representation. Neighboring cells may be abutted to each other. The design of the standard cells in the cell library has to follow a set of design rules, and the features (such as well regions, active regions, polysilicon lines, metal lines, contact plugs, vias, and the like) in the standard cells have to be designed without violating the design rules. In the double patterning technology, the standard cell design also needs to follow certain design rules, among which is the spacing requirement.

Figure 3A:
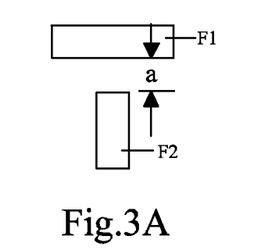
FIGS. 3A through 3D illustrate how the minimum same-mask distances are determined for different exemplary situations.
Figure 3B:
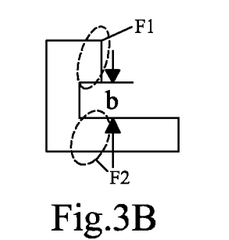
Figure 3C:
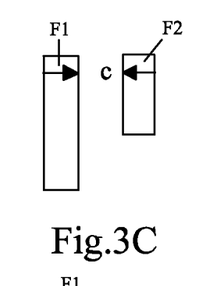
Figure 3D:
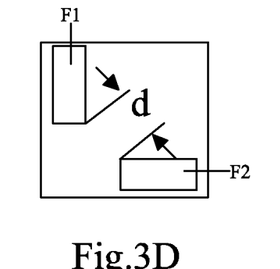

FIGS. 3a through 3d illustrate various exemplary embodiments in which the spacing requirement needs to be enforced. Referring to FIG. 3A, features F1 and F2 are separated features with lengthwise directions perpendicular to each other and with distance a. Assuming the minimum spacing allowed in the formation technology (for example, 60 nm technology, 45 nm technology, or the like) of the respective integrated circuit is S, then the minimum same-mask distance (alternatively referred to as G0 distance hereinafter) between features (which are actually patterns of the features in the layouts) F1 and F2 in FIG. 3A may be defined as being 2.1 S, for example. This means that if distance a is smaller than the minimum same-mask distance 2.1 S, then features F1 and F2 have to be separated into two masks of a double-patterning mask set. Otherwise, the design rule is violated. It is noted that the minimum same-mask distance for different patterns may be different. For example, in FIG. 3B, the minimum same-mask distance may be 1.6 S, which means that if distance b of different portions F1 and F2 of a same feature is smaller than 1.6 S, then the feature that includes portions F1 and F2 has to be redesigned until distance b is greater than the minimum same-mask distance. In FIG. 3C, features F1 and F2 have their lengthwise direction parallel to each other with distance c, and the respective minimum same-mask distance may be 1.6 S. In FIG. 3D, diagonally located features F1 and F2 with distance d may have a minimum same-mask distance 1.6 S, for example, which means distance d needs to be greater than 1.6 S, unless features F1 and F2 are in different masks of a double-patterning mask set.

Although the minimum same-mask distance between different features may be different depending on how the features are laid out, and depending on which technology is used for forming the respective integrated circuits, the minimum same-mask distances can still be pre-determined, for example, by determining which of the situations in FIGS. 3a through 3d apply (although there may be more situations), and determining the forming technology before the standard cells are designed. The defined minimum same-mask distances are then enforced when the standard cells are designed.

Figure 4A:
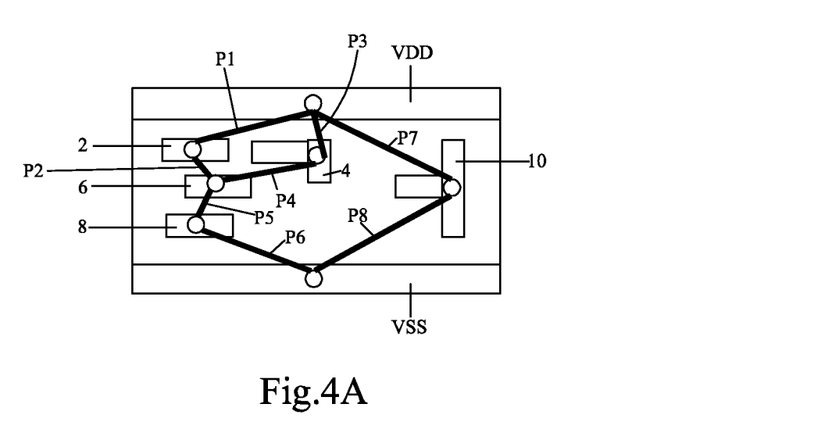
FIG. 4A illustrates a cell with all double-patterning full traces having even numbers (2 or 4) of G0 paths.

FIG. 4A illustrates an exemplary standard cell, which includes features VDD, VSS, 2, 4, 6, 8, and 10. Features VDD, VSS, 2, 4, 6, 8, and 10 may be in two lithography masks of a same double-patterning mask set. By applying the design rules, it can be determined whether the distances between the features in the standard cell are smaller than the respective minimum same-mask distances. If the distance between two features is smaller than the respective minimum same-mask distance, a line can be drawn connecting these two features, and the line is referred to as a G0 path hereinafter. Conversely, if the distance between two features is equal to or greater than the respective minimum same-mask distance, no G0 path is drawn. Accordingly, in FIG. 4A, there exist eight G0 paths, P1 through P8. It is noted that each of the G0 paths interconnects two features (patterns) that have to be decomposed (separated) into two masks of the double-patterning mask set.

If the G0 paths in a standard cell can be used to establish a trace traversing from feature VDD all the way to feature VSS, then the trace is referred to as a double-patterning full trace. Accordingly, in the cells shown in FIG. 4A, there are three double-patterning full traces, namely trace T1 including G0 paths P1, P2, P5, and P6, trace T2 including G0 paths P3, P4, P5, and P6, and trace T3 including G0 paths P7 and P8. It is realized that a cell may include one or more double-patterning full traces, or does not include any double-patterning full trace. For example, assuming the cell in FIG. 4A does not include features 8 and 10, and the distance between features 6 and VSS is greater than the respective minimum same-mask distance, then the cell does not have any double-patterning full trace.

When the double patterning technology is used, the standard cells in the cell library have to be able to be decomposed into the two masks of the double-patterning mask with no native conflicts inside any of the standard cells. Accordingly, the standard cells are G0 conflict-free, which means that any two features with a distance smaller than the respective minimum same-mask distance can be separated into the two masks of the double-patterning mask set. Accordingly, either all the double-patterning full traces in the same standard cell have even numbers of G0 paths (with the respective double-patterning full traces being referred to as even-number full trace hereinafter), or all the double-patterning full traces in the same standard cell have odd numbers of G0 paths (with the respective double-patterning full traces being referred to as odd-number full trace hereinafter). Using the cell in FIG. 4A as an example, the numbers of G0 paths in the double-patterning full traces T1, T2, and T3, are 4, 4, and 2, respectively, which are all even numbers, and hence the cell in FIG. 4A is a G0 conflict-free cell.

Figure 4B:
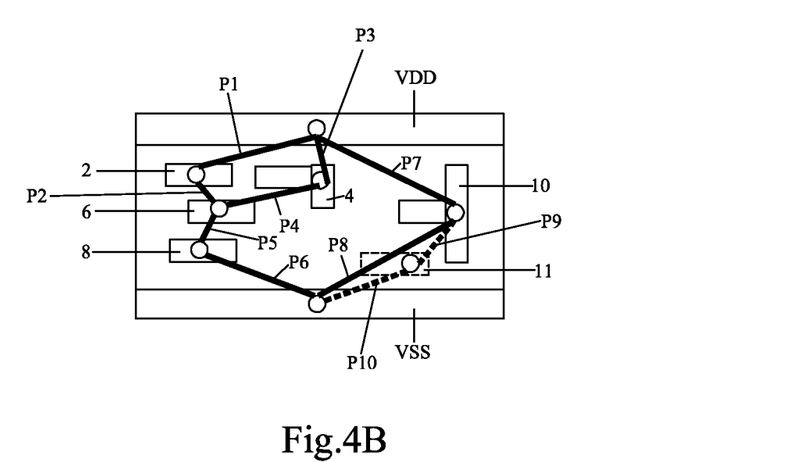
FIG. 4B illustrates a cell with all double-patterning full traces having even numbers (2 or 4) of G0 paths and an odd number (3) of G0 paths.

Referring to FIG. 4B, assuming that if feature 11 is added, then G0 paths P9 and P10 will be added to the existing G0 paths. This further results in the addition of a new double-patterning full trace, including G0 paths P7, P8, and P9. As a result, the cell in FIG. 4B, includes double-patterning full traces with even numbers (2 and 4) of G0 paths, and a double-patterning full trace with an odd number (3) of G0 paths. Accordingly, any even-number full trace may form a loop with any odd-number full trace, and it can be found that the features in the loop cannot be successfully separated into the two masks of a double-patterning mask set without causing native conflicts.

Figure 5:
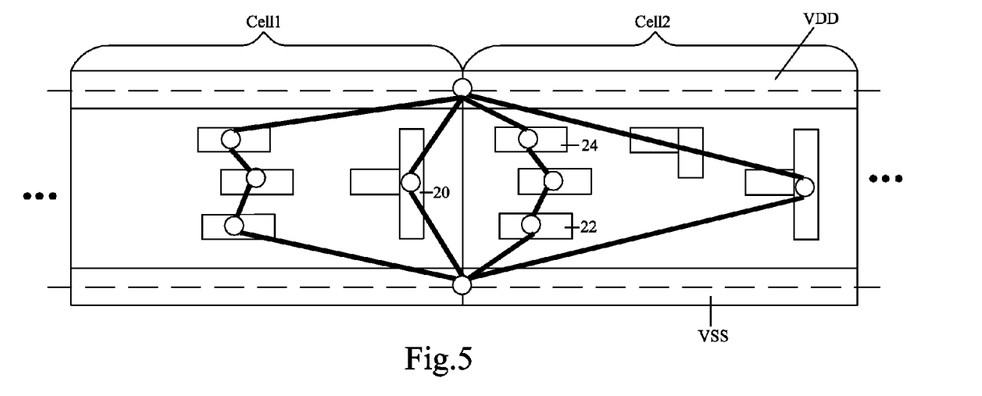
FIG. 5 illustrates the abutting of two cells, with no new conflict being generated when the cells are abutted.

FIG. 5 illustrates the abutting of two cells cell1 and cell2. With two cells abutted, the VDDs of cells cell1 and cell2 are joined, and the VSSs in the cells cell1 and cell2 are joined. Accordingly, if one of cells cell1 and cell2 has an even-number full trace, while the other one has an odd-number full trace, when the even-number full trace forms a loop with the odd-number full trace, the features involved in the loop cannot be separated into the two masks of a double-patterning mask set. Accordingly, the double-patterning full traces in cells cell1 and cell2 are designed to be either all even-number full traces or all odd-number full traces.

It is realized that when an integrated circuit is designed, the cells in the integrated circuit may be arranged as a plurality of rows (with cells cell1 and cell2 in FIG. 5 being part of one row, for example), with each row including multiple cells, for example, more than 100, or even 1,000 cells, and all double-patterning full traces of all of the cells in a same row either have even numbers of G0 paths (with the corresponding design rule being referred to as a even-number-only rule), or have odd numbers of G0 paths (with the corresponding design rule being referred to as an odd-number-only rule). Further, in a same semiconductor chip, there will be multiple cells, and all double-patterning full traces of all of the cells in the same chip may have either even numbers of G0 paths, or odd numbers of G0 paths.

As a cell may possibly be abutted with any other cell in the cell library, and when they are abutted, the double-patterning full traces in the abutted cells either need to be all even-number full traces, or need to be all odd-number full traces. Design rules may thus be enforced in the cell design so that all, or substantially all (for example, more than about 80 percent, more than about 90 percent, or even more than about 95 or 99 percent), cells in the cell library either have their double-patterning full traces being all even-number full traces or all odd-number full traces. The respective design rules are the even-number-only rule or the odd-number-only rule, respectively. In other words, either no cell, or substantially no cell, in the cell library has any odd-number full trace, or no cell, or substantially no cell, in the cell library has any even-number full trace. With such a design rule enforced, any two cells in the cell library may be abutted without the concern of generating new native conflicts.

In alternative embodiments, the cell library may include cells with all of their double-patterning full traces being even-number full traces, and additional cells with all of their double-patterning full traces being odd-number full traces. The cells in the cell library may be marked so that when cells are placed in integrated circuits, each row of cells will only include the cells with all of their double-patterning full traces being even-number full traces, or only include the cells with all of their double-patterning full traces being odd-number full traces. To meet such a placement requirement, the type of cells (whether all of their double-patterning full traces are even-number full traces or odd-number full traces) are marked/recorded for the respective cells so that a cell with a correct type may be selected. At the time of placement for a row of an integrated circuit, only the cells meeting the placement requirement are selected and placed (by determining their types), while the cells violating the placement requirement are de-selected and not placed into the row. However, different rows may, or may not, have opposite placement requirements. For example, a first row may only include cells with all of their double-patterning full traces being even-number full traces, while a second row may only include cells with all of their double-patterning full traces being odd-number full traces.

In an embodiment, there may be an existing cell library that has already been designed, wherein all the individual cells in the cell library are already G0 conflict-free. However, the double-patterning full traces in some of the cells already have even numbers of G0 paths, while the double-patterning full traces in some of other cells already have odd numbers of G0 paths. Therefore, the cell library may be modified by applying the odd-number-only rule or the even-number-only rule, so that no cell, or substantially no cell, in the cell library has any even-number full trace, or no cell, or substantially no cell, in the cell library has any odd-number full trace. The modification of the cell library may involve determining a design rule (whether even-number-only rule is desirable, or odd-number-only rule is desirable), examining all of the cells in the cell library to determine the numbers of G0 paths in their double-patterning full traces, so that the cells that do not meet the criteria (referred to as non-compliant cells) are retrieved, and modifying (re-laying out) the non-compliant cells to generate new cells that comply with the design rule. The modified cells are then saved into the existing cell library to replace the non-compliant cells.

Figure 6:
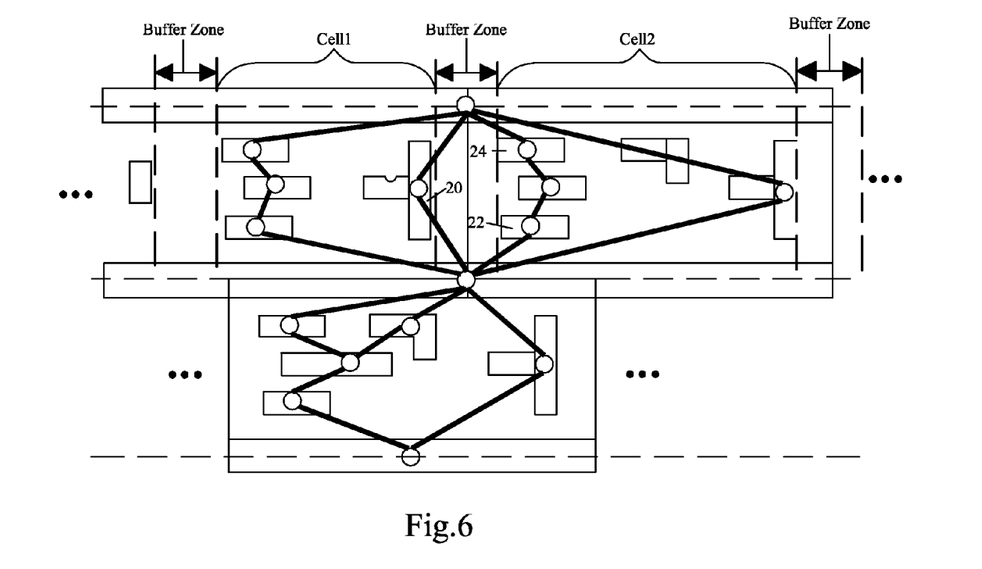
FIG. 6 illustrates the buffer zone inserted between two cells.

By using the double-patterning technology, the features in cells can be compacted, so that the chip areas of the cells are reduced. However, when two cells are abutted, the features in neighboring cells may be in a same lithography mask, and hence cannot have distances smaller than the minimum same-mask distance. For example, in FIG. 6 (please also refer to FIG. 5), features 20, 22, and 24 will be in a same lithography mask (please note the lines representing G0 paths, which forces features 20, 22, and 24 to be placed in a same mask). Therefore, a buffer zone needs to be inserted between cell1 and cell2, so that the distance between features 20 and 22, and the distance between features 20 and 24 are equal to or greater than the respective minimum same-mask distances. The buffer zone may include only a VDD line and a VSS line, but no other feature (pattern). The buffer zone occupies the chip area, and hence is preferably not inserted if possible.

Figure 7A:
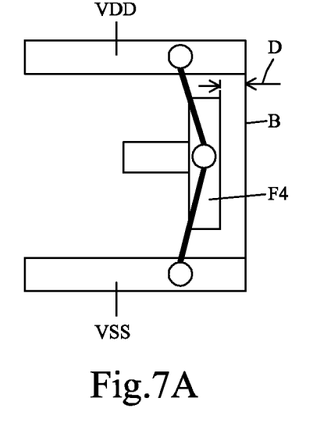
FIGS. 7A through 7F illustrate different types of cell boundaries.
Figure 7B:
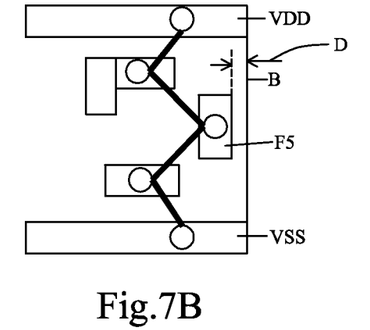
Figure 7C:
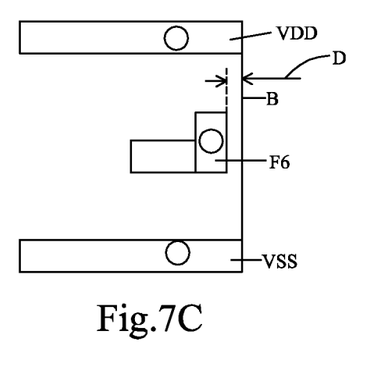
Figure 7D:
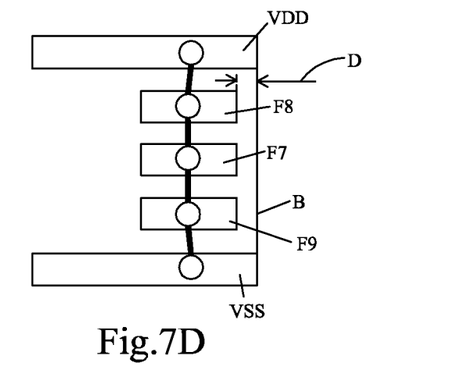
Figure 7E:
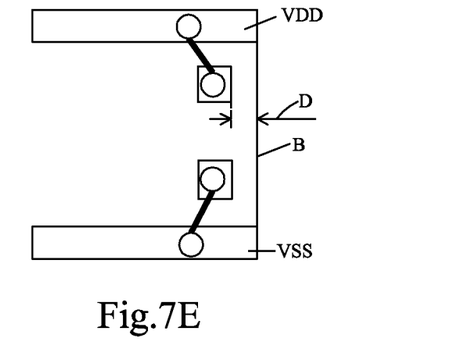
Figure 7F:
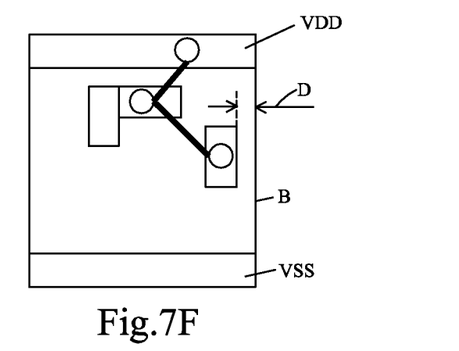

FIGS. 7A through 7E are exemplary cells having boundary features. The features that have distances D from boundaries B smaller than one-half of the minimum same-mask distance are boundaries features. In FIG. 7A, boundary feature F4 needs to be in a deferent mask than features VDD and VSS (due to the existence of the two G0 paths). The illustrated cell boundary B in FIG. 7A is thus referred to as a different-type (D-type) boundary. In FIG. 7B, boundary feature F5 needs to be in a same mask as features VDD and VSS. The illustrated cell boundary in FIG. 7B is thus referred to as a same-type (S-type) boundary. In FIG. 7C, boundary feature F6 may be in a same mask as, or a different mask from, features VDD and VSS (since no Go path exists between feature F6 and VDD/VSS). The illustrated cell boundary in FIG. 7C is thus referred to as a no-care-type (X-type) boundary. In FIG. 7D, boundary feature F7 needs to be in a same mask as features VDD and VSS, while boundary features F8 and F9 need to be in a mask different from the mask of features VDD and VSS. The illustrated cell boundary in FIG. 7D is thus referred to as a mixed-type (M-type) boundary. FIG. 7E illustrates another D-type boundary, while FIG. 7F illustrates another S-type boundary.

When the following cell boundaries are abutted, no buffer zone needs to be inserted: a D-type boundary abutted to an S-type boundary (referred to as a D-S type abutting), an X-type boundary abutted to an S-type boundary (referred to as an X-S type abutting), an X-type boundary abutted to a D-type boundary (referred to as an X-D type abutting), or an X-type boundary abutted to an X-type boundary (referred to as an X-X type abutting). FIGS. 8A, 8B, 8C, and 8D illustrate examples of the D-S type abutting, X-S type abutting, X-D type abutting, and X-X type abutting, respectively. It can be found from FIGS. 8A through 8D that even without the buffer zones, the decomposition of the features into different masks of a same mask set can still be achieved.

Figure 8A:
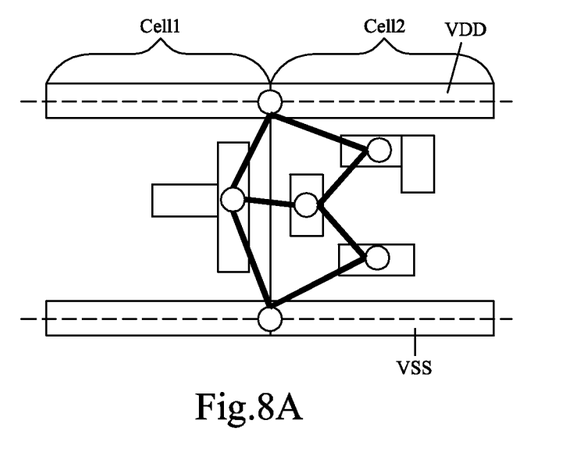
FIGS. 8A through 8D illustrate the abutting of different types of cell boundaries, wherein no design-rule violation occurs.
Figure 8B:
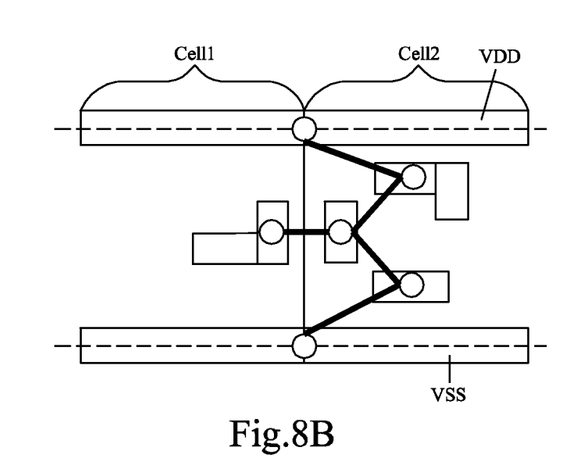
Figure 8C:
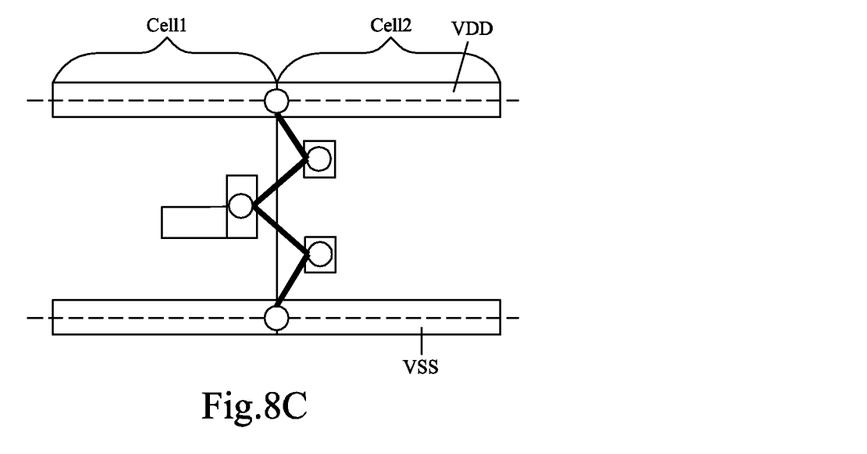
Figure 8D:
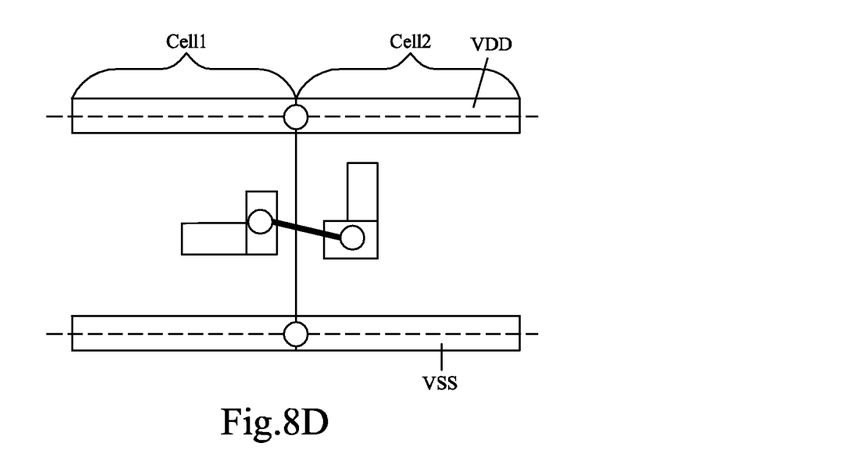

Alternatively, with an M-type boundary abutted to an X-type boundary (referred to as an M-X type abutting), an M-type boundary abutted to an M-type boundary (referred to as an M-M type abutting), an M-type boundary abutted to a D-type boundary (referred to as an M-D type abutting), or an M-type boundary abutted to an S-type boundary (referred to as an M-S type abutting), buffer zones may be needed. Combining the guidelines of the boundary abutting as shown in FIGS. 8B through 8D with the design rules related to FIGS. 4 and 5, the chip area of integrated circuits can be significantly reduced.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor chip comprising:
   a row of cells of a first half-pitch technology, adjacent cells butted together and free of a buffer zone therebetween, with each of the cells comprising:
   a plurality of features comprising at least a VDD line and a VSS line;

a plurality of first distances each measured between each adjacent pair of the plurality of features;

at least one G0 path, each G0 path representing one of the plurality of first distances that is less than a minimum spacing allowed by the first half-pitch technology; and one or more double-patterning full traces comprising one or more G0 paths contiguously traversing from the VDD line to the VSS line;

wherein all VDD lines of the cells are connected as a single VDD line, and all VSS lines of the cells are connected as a single VSS line; and wherein all of the at least one double-patterning full traces in each cell have only an odd number of G0 paths or an even number of G0 paths.

2. The semiconductor chip of claim 1, wherein no double-patterning full trace in the row of cells has an even number of G0 paths.

3. The semiconductor chip of claim 1, wherein no double-patterning full trace in the row of cells has an odd number of G0 paths.

4. The semiconductor chip of claim 1 further comprising a plurality of rows of cells, wherein no double-patterning full trace in any cell in the plurality of rows of cells has an even number of G0 paths.

5. The semiconductor chip of claim 4, wherein no double-patterning full trace having an odd numbers of G0 path exists in any cell in the semiconductor chip.

6. The semiconductor chip of claim 1, wherein each of the G0 paths interconnects two patterns separated into different lithography masks of a same double-patterning mask set.

7. The semiconductor chip of claim 1, wherein the row of cells comprises a first cell and a second cell butted together, with no buffer zone inserted there between, and wherein the first cell and the second cell have an abutting type selected from the group consisting essentially of a D-S type abutting, an X-S type abutting, an X-D type abutting, and an X-X type abutting.

8. An integrated circuit cell library embodied on a non-transitory computer readable medium, comprising:

a plurality of cells of a fabrication feature half-pitch size technology, each cell comprising:
a plurality of features;
a plurality of first distances each measured between closest points of two adjacent ones of the plurality of features;
at least one G0 path, each G0 path representing one of the plurality of first distances that is less than a first minimum distance; and
one or more double-patterning full traces comprising one or more G0 paths contiguously traversing the cell from a VDD line to a VSS line and including at least one of the plurality of features other than the VDD line and the VSS line;

wherein substantially all double-patterning full traces of substantially all cells in the integrated circuit cell library have even numbers of G0 paths or substantially all double-patterning full traces of substantially all cells in the integrated circuit cell library have odd numbers of G0 paths;

wherein the first minimum distance is the minimum distance at which adjacent features are fabricated with a same mask in the fabrication feature half-pitch size technology.

9. The integrated circuit cell library of claim 8, wherein the substantially all double-patterning full traces have even numbers of G0 paths.

10. The integrated circuit cell library of claim 8, wherein the substantially all double-patterning full traces have odd numbers of G0 paths.

11. The integrated circuit cell library of claim 8, wherein the plurality of cells comprises a cell comprising no double-patterning full trace.

12. The integrated circuit cell library of claim 8, wherein a cell in the plurality of cells comprises a plurality of double-patterning full traces, with all double-patterning full traces in the cell either having even numbers of G0 paths or having odd numbers of G0 paths.

13. The integrated circuit cell library of claim 8, wherein all double-patterning full traces of substantially all cells in the integrated circuit cell library have either even numbers of G0 paths or odd numbers of G0 paths.

14. The integrated circuit cell library of claim 8, wherein each of the G0 paths interconnects two patterns separated into two lithography masks of a same double-patterning mask set.

15. An integrated circuit cell library embodied on a non-transitory computer readable medium, comprising:

a plurality of cells of a first fabrication size technology, each cell comprising:
a plurality of features;
a plurality of first distances measured between two of the plurality of features;
at least one G0 path, each G0 path representing one of the plurality of first distances that is less than a first minimum inter-feature distance; and
one or more double-patterning full traces comprising a plurality of G0 paths traversing the cell;

wherein substantially no double-patterning full trace in any cell in the integrated circuit cell library has an even number of G0 paths, or substantially no double-patterning full trace in any cell in the integrated circuit cell library has an odd number of G0 paths;

wherein the first inter-feature distance is the minimum distance at which adjacent features are fabricated with a same mask according to the first feature fabrication technology; and wherein at least one cell of the plurality of cells has at least one feature within a distance less than the first inter-feature distance of a border of the at least one cell.

16. The integrated circuit cell library of claim 15, wherein substantially no double-patterning full trace in the any cell in the integrated circuit cell library has an even number of G0 paths.

17. The integrated circuit cell library of claim 15, wherein substantially no double-patterning full trace in the any cell in the integrated circuit cell library has an odd number of G0 paths.

18. The integrated circuit cell library of claim 15, wherein the plurality of cells comprises a cell comprising no double-patterning full trace.

19. The integrated circuit cell library of claim 15, wherein a cell in the plurality of cells comprises a plurality of double-patterning full traces, with all double-patterning full traces in the cell either having even numbers of G0 paths or having odd numbers of G0 paths.

20. The integrated circuit cell library of claim 15, wherein each of the G0 paths interconnects two patterns separated into different lithography masks of a same double-patterning mask set.

* * * * *